(12) United States Patent
Rengarajan et al.

(10) Patent No.: US 10,582,608 B2
(45) Date of Patent: Mar. 3, 2020

(54) INTERCONNECTION BETWEEN PRINTED CIRCUIT BOARDS

(71) Applicant: HCL Technologies Limited, Noida, Uttar Pradesh (IN)

(72) Inventors: Shanmugan Rengarajan, Chennai (IN); Mahesh Subramaniam, Bangalore (IN); Chayan Roy, Chennai (IN); Debojyoti Choudhuri, Chennai (IN)

(73) Assignee: HCL Technologies Limited, Noida, Uttar Pradesh ( * ) Notice: Subject to any disclaimer, the term of this patent is extended or adjusted under 35 U.S.C. 154(b) by 360 days.

(21) Appl. No.: 15/627,290

(22) Filed: Jun. 19, 2017

(65) Prior Publication Data
US 2018/0027647 A1    Jan. 25, 2018

(30) Foreign Application Priority Data

Jul. 20, 2016   (IN) .............................. 201611024909

(51) Int. Cl.
*H05K 1/02*      (2006.01)
*H05K 1/11*      (2006.01)
(Continued)

(52) U.S. Cl.
CPC .............. *H05K 1/0216* (2013.01); *G01S 7/03* (2013.01); *G01S 7/032* (2013.01); *H01P 3/08* (2013.01);
(Continued)

(58) Field of Classification Search
CPC .... H05K 1/0216; H05K 1/145; H05K 1/0243; H05K 1/0222; H05K 1/14; H05K 1/115;
(Continued)

(56) References Cited

U.S. PATENT DOCUMENTS 3,641,573 A * 2/1972 Albanese .............. G01S 13/325
                                                              342/131
4,733,237 A * 3/1988 Apostolos ................. G01S 7/36
                                                               342/13

(Continued)

FOREIGN PATENT DOCUMENTS

CN      202750123 U    2/2013
EP         2945222      11/2015

*Primary Examiner* — Frank J McGue
(74) *Attorney, Agent, or Firm* — HM Law Group LLP; Vanintheran Moodley

(57) ABSTRACT

Disclosed is a method and device for interconnection of printed circuit boards operating at millimeter wave frequency band. The device comprises a primary printed circuit board, a secondary printed circuit board, an interconnection module for coupling electromagnetic energy from the primary printed circuit board to the secondary printed circuit board. The primary printed circuit board further comprising a primary top dielectric layer, specific via arrangements, a radio frequency chip, a primary high frequency transmission line connected to the radio frequency chip at one end and other end to a first inset-fed patch. The secondary printed circuit board further comprising a secondary top dielectric layer, specific via arrangements, a printed array antenna, a secondary high frequency transmission line connected to printed array antenna at one end, and other end to a second inset-fed patch. The interconnection module further comprising a first cut-out section, a second cut-out section and a slot.

20 Claims, 7 Drawing Sheets

(51) Int. Cl.
*H05K 1/14* (2006.01)
*H01P 3/08* (2006.01)
*H01Q 1/48* (2006.01)
*H01Q 9/04* (2006.01)
*G01S 7/03* (2006.01)
*H01P 5/107* (2006.01)
*H01Q 21/06* (2006.01)
*H01Q 1/32* (2006.01)
*G01S 13/93* (2006.01)
*H05K 1/16* (2006.01)
*H01Q 1/22* (2006.01)
*G01S 13/931* (2020.01)

(52) U.S. Cl.
CPC ........... *H01P 5/107* (2013.01); *H01Q 1/3233* (2013.01); *H01Q 1/48* (2013.01); *H01Q 9/0407* (2013.01); *H01Q 21/065* (2013.01); *H05K 1/0222* (2013.01); *H05K 1/0243* (2013.01); *H05K 1/115* (2013.01); *H05K 1/14* (2013.01); *H05K 1/145* (2013.01); *G01S 13/931* (2013.01); *H01Q 1/2283* (2013.01); *H05K 1/0206* (2013.01); *H05K 1/0219* (2013.01); *H05K 1/165* (2013.01); *H05K 2201/042* (2013.01); *H05K 2201/09609* (2013.01); *H05K 2201/10098* (2013.01)

(58) Field of Classification Search
CPC ... H05K 2201/09609; H05K 2201/042; H05K 1/165; H05K 1/0219; H05K 1/0206; H05K 2201/10098; H01Q 1/3233; H01Q 21/065; H01Q 9/0407; H01Q 1/48; H01Q 1/2283; H01P 5/107; H01P 3/08; G01S 7/032; G01S 7/03; G01S 13/931
USPC .......................................................... 342/175
See application file for complete search history.

(56) References Cited

U.S. PATENT DOCUMENTS

| | | | | |
|---|---|---|---|---|
| 6,137,064 A | * | 10/2000 | Kiani | H05K 1/0222 |
| | | | | 174/261 |
| 6,317,948 B1 | * | 11/2001 | Kola | H05K 1/162 |
| | | | | 205/125 |
| 2005/0141655 A1 | * | 6/2005 | Lee | H03J 7/04 |
| | | | | 375/344 |
| 2015/0219751 A1 | * | 8/2015 | Ebling | G01S 7/038 |
| | | | | 342/175 |
| 2015/0318597 A1 | | 11/2015 | Park et al. | |
| 2016/0238998 A1 | * | 8/2016 | Pavlovic | G04F 10/005 |
| 2016/0377711 A1 | * | 12/2016 | Arage | G01S 7/285 |
| | | | | 342/118 |

* cited by examiner

US 10,582,608 B2

INTERCONNECTION BETWEEN PRINTED CIRCUIT BOARDS

CROSS-REFERENCE TO RELATED APPLICATIONS AND PRIORITY

The present application claims priority from Indian Patent Application No. 201611024909 filed on 20 Jul. 2016 the entirety of which is hereby incorporated by reference.

TECHNICAL FIELD

The present subject matter described herein, in general, relates to a device and a method for interconnection, and more particularly a device and a method for interconnection of printed circuit boards operating at millimeter wave frequency band.

BACKGROUND

Currently, efforts to achieve a goal of zero automotive-related fatalities, meeting consumer demand and government legislation, are driving adoption of advanced automotive safety devices in the automotive industries. Automotive RADAR is one of the fast growing technologies that operate at extremely high frequency bands and supports advanced automotive safety devices. Typically, automotive RADAR supports adaptive cruise control, pre-crash protection, collision warning devices, blind spot detection, side impact detection, headway alert, automatic steering and braking intervention in an automobile. Conventionally, automotive RADAR operates in millimeter wave frequency range. The millimeter wave frequency range extends from 30 GHz to 300 GHz, as the wavelengths associated with millimeter wave frequency range are in the range of 1 to 10 millimeters.

Conventional automotive Long Range RADAR (LRR) operates in the frequency range of 76-77 GHz. Further, the analog circuits, digital components along with the radio frequency circuitry and the printed antenna design are present on the same board in the conventional automotive Long Range RADAR (LRR). Generally, in the conventional automotive Long Range RADAR (LRR), transmission of signal at millimeter wave frequency range results in very high radiation loss, dielectric loss and absorption loss. Further, at such high frequencies, is difficult to check the output of the radio frequency chip using test points or direct probing. Testing of standalone antenna to generate parameters such as Voltage Standing Wave Ratio (VSWR), gain, radiation patterns etc. also becomes inconceivable. To overcome these drawbacks, the automotive RADAR system designs are configured such that the antenna and the radio frequency chips are implemented on separate printed circuit boards (PCB).

Traditionally, the signal from one printed circuit board is connected to another printed circuit board through coaxial cable assemblies, but at millimeter wave frequencies, this methodology results in high loss. Further, 1 mm coaxial cables used for transmission of millimeter wave signals are very costly. Other conventional methodologies use standard waveguides with big flanges but such conventional methodologies enlarge the size of the overall device. The standard waveguides are also bulky and costly. Furthermore, other conventional connectors are complex and require a costly manufacturing process due to necessity of precise cavities in the PCB. Moreover, it is hard to control or measure thickness of plated copper inside the PCB cavity resulting in resonance frequency shift and thereby a lossy interconnection.

SUMMARY

Before the present device and methods for interconnection of printed circuit boards operating at millimeter wave frequency band, are described, it is to be understood that this application is not limited to the particular devices, and methodologies described, as there may be multiple possible embodiments which are not expressly illustrated in the present disclosures. It is also to be understood that the terminology used in the description is for the purpose of describing the particular implementations or versions or embodiments only, and is not intended to limit the scope of the present application. This summary is provided to introduce aspects related to a device and a method for interconnection of printed circuit boards operating at millimeter wave frequency band. This summary is not intended to identify essential features of the claimed subject matter nor is it intended for use in determining or limiting the scope of the claimed subject matter.

In one implementation, a device for interconnection of printed circuit boards operating at millimeter wave frequency band is disclosed. In one aspect, the device comprises a primary printed circuit board, a secondary printed circuit board and a an interconnection module for coupling an electromagnetic energy from the primary printed circuit board to the secondary printed circuit board. The primary printed circuit board further comprises a primary top dielectric layer on the primary printed circuit board, a radio frequency chip on the primary top dielectric layer, a primary high frequency transmission line extending from the radio frequency chip and connected to the radio frequency chip at one end, a first inset-fed patch connected to other end of the high frequency transmission line, a first arrangement of plated through holes (ground vias) surrounding the primary high frequency transmission line, a second arrangement of plated through holes (ground vias) surrounding the first inset-fed patch. Further, the first arrangement of plated through holes (ground vias), and the second arrangement of plated through holes (ground vias) form a ground connection between a ground shape on the primary top conductive surface and primary bottom conductive surface ground plane. The secondary printed circuit board further comprises a secondary top dielectric layer on the secondary printed circuit board, a printed array antenna on the secondary top dielectric layer, a secondary high frequency transmission line extending from the printed array antenna and connected to printed array antenna at one end, a second inset-fed patch connected to other end of the high frequency transmission line, a third arrangement of plated through holes (ground vias) surrounding the secondary high frequency transmission line, a fourth arrangement of plated through holes (ground vias) surrounding the second inset-fed patch. Further, the third arrangement of plated through holes (ground vias), and the fourth arrangement of plated through holes (ground vias) form a ground connection between a ground shape on the secondary top conductive surface and a secondary bottom conductive surface ground plane. The interconnection module made of metal further comprises a first cut-out section on one surface of the interconnection module a second cut-out section on opposite surface of the interconnection module, a slot along the thickness of the interconnection module for connecting the first cut-out section and the second cut out section. Further, the slot is configured to receive the first inset-fed patch at one end and the second inset-fed patch at other end and transfer the electromagnetic energy from the first inset-fed patch to the second inset-fed patch.

A method for interconnection of printed circuit boards operating at millimeter wave frequency band, the method comprising obtaining a primary printed circuit board comprising a primary top dielectric layer on the primary printed circuit board, a radio frequency chip on the primary top dielectric layer, a primary high frequency transmission line extending from the radio frequency chip and connected to the radio frequency chip at one end, a first inset-fed patch connected to other end of the high frequency transmission line, a first arrangement of plated through holes (ground vias) surrounding the primary high frequency transmission line, a second arrangement of plated through holes (ground vias) surrounding the first inset-fed patch. Further, the first arrangement of plated through holes (ground vias), and the second arrangement of plated through holes (ground vias) form a ground connection between a ground shape on the primary top conductive surface and primary bottom conductive surface ground plane. The method further comprises obtaining a secondary printed circuit board comprising a secondary top dielectric layer on the secondary printed circuit board, a printed array antenna on the secondary top dielectric layer, a secondary high frequency transmission line extending from the printed array antenna and connected to printed array antenna at one end, a second inset-fed patch connected to other end of the high frequency transmission line, a third arrangement of plated through holes (ground vias) surrounding the secondary high frequency transmission line, a fourth arrangement of plated through holes (ground vias) surrounding the second inset-fed patch, Further, the third arrangement of plated through holes (ground vias), and the fourth arrangement of plated through holes (ground vias) form a ground connection between a ground shape on the secondary top conductive surface and a secondary bottom conductive surface ground plane. The method furthermore comprises coupling an electromagnetic energy from the primary printed circuit board to the secondary printed circuit board utilizing an interconnection module made of metal, wherein the interconnection module further comprising a first cut-out section on one surface of the interconnection module a second cut-out section on opposite surface of the interconnection module, a slot along the thickness of the interconnection module, connecting the first cut-out section and the second cut out section, wherein the slot is configured to receive the first inset-fed patch at one end and the second inset-fed patch at other end and transfer the electromagnetic energy from the first inset-fed patch to the second inset-fed patch.

BRIEF DESCRIPTION OF THE DRAWINGS

The foregoing detailed description of embodiments is better understood when read in conjunction with the appended drawings. For the purpose of illustrating of the present subject matter, an example of construction of the present subject matter is provided as figures; however, the invention is not limited to the specific method and device disclosed in the document and the figures.

The present subject matter is described detail with reference to the accompanying figures. The same numbers are used throughout the drawings to refer various features of the present subject matter.

DETAILED DESCRIPTION

Figure 1:
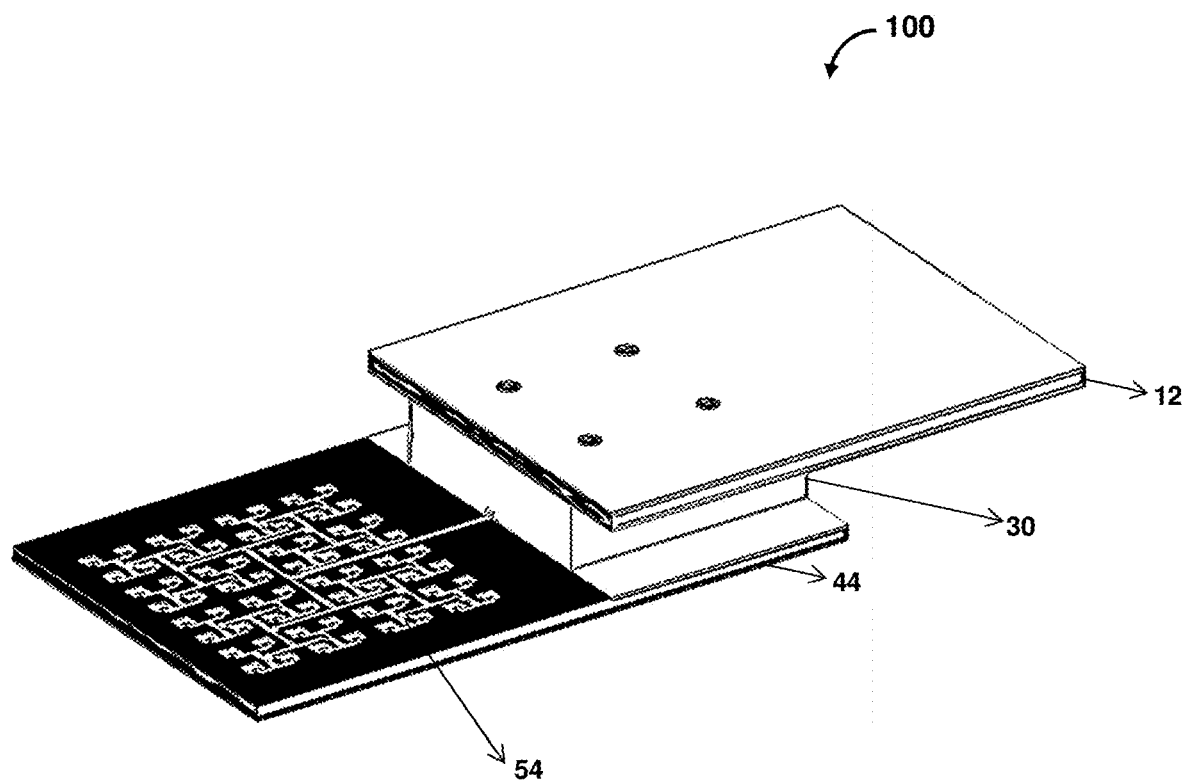
FIG. 1 illustrates an isometric view of the device comprising an interconnection module between a primary printed circuit board containing a radio frequency chip and a secondary printed circuit board containing an antenna array, in accordance with an embodiment of the present subject matter.

Some embodiments of this disclosure, illustrating all its features, will now be discussed in detail. The words "comprising," "having," "containing," and "including," and other forms thereof, are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise. Although any devices and methods for interconnection of printed circuit boards operating at millimeter wave frequency band, similar or equivalent to those described herein may be used in the practice or testing of embodiments of the present disclosure, the exemplary, devices and methods for interconnection of printed circuit boards operating at millimeter wave frequency band are now described. The disclosed embodiments for interconnection of printed circuit boards operating at millimeter wave frequency band are merely examples of the disclosure, which may be embodied in various forms.

Various modifications to the embodiment will be readily apparent to those skilled in the art and the generic principles herein may be applied to other embodiments for interconnection of printed circuit boards operating at millimeter wave frequency band. However, one of ordinary skill in the art will readily recognize that the present disclosure for interconnection of printed circuit boards operating at millimeter wave frequency band is not intended to be limited to the embodiments described, but is to be accorded the widest scope consistent with the principles and features described herein.

In an implementation, a device and method for interconnection of printed circuit boards operating at millimeter wave frequency band, is described. In one aspect, the device comprises a primary printed circuit board, a secondary printed circuit board and an interconnection module.

The primary printed circuit board further comprises a primary top conducting surface above the primary top dielectric layer, a radio frequency chip soldered to the top dielectric layer, a primary high frequency transmission line extending from the radio frequency chip and connected to the radio frequency chip at one end, a first inset-fed patch connected to other end of the high frequency transmission line. In one example, the primary top and bottom conducting surfaces may be made of copper. Further, the primary printed circuit board may contain single dielectric layer or multiple dielectric layers. In one other example, the primary high frequency transmission line may be a micro-strip line, a strip line, a coplanar waveguide, a coplanar waveguide with ground (CPWG). Further, the portion of transmission line connecting to the inset-fed patch is designed to be CPWG. The primary printed circuit board also has primary bottom conducting surface ground plane. Further, the primary printed circuit board may comprise one or more primary plated through holes (vias). Furthermore the primary printed circuit board may comprise a first arrangement of plated through holes (ground vias) surrounding the primary high frequency transmission line, a second arrangement of plated through holes (ground vias) surrounding the first inset-fed patch In the example, the first arrangement of plated through holes (ground vias), and the second arrangement of plated through holes (ground vias) may form a ground connection between a ground shape on the primary top conductive surface and primary bottom conductive surface ground plane.

The secondary printed circuit board may comprise a secondary top conducting surface above the secondary top dielectric layer, a printed array antenna on the top dielectric layer, a secondary high frequency transmission line extending from the printed array antenna and connected to printed array antenna at one end, a second inset-fed patch connected to other end of the high frequency transmission line. In one example, the secondary top and bottom conducting surfaces are made of copper. In one other example, the secondary printed circuit board 44 may contain single dielectric layer or multiple dielectric layers. In one other example, the secondary high frequency transmission line may be a micro-strip line, a strip line, a coplanar waveguide, a coplanar waveguide with ground (CPWG). Further, the portion of transmission line connecting to the inset-fed patch is designed to be CPWG. The secondary printed circuit board also has secondary bottom conducting surface ground plane. The secondary printed circuit board may further comprise one or more secondary plated through holes (vias). Furthermore, the secondary printed circuit board may comprise a third arrangement of plated through holes (ground vias) surrounding the secondary high frequency transmission line, a fourth arrangement of plated through holes (ground vias) surrounding the second inset-fed patch. In the example, the third arrangement of plated through holes (ground vias), and the fourth arrangement of plated through holes (ground vias) may form a ground connection between a ground shape on the secondary top conductive surface and a secondary bottom conductive surface ground plane.

The interconnection module made of metal, for coupling the energy from the top surface of the primary printed circuit board to the top surface of the secondary printed circuit board. The interconnection module further comprises a first cut-out on one surface of the interconnection module designed and configured to avoid short-circuiting with the primary high frequency transmission line and for controlling the loss/leakage of electromagnetic energy out of the interconnection module, a second cut-out section on opposite surface of the interconnection module designed and configured to avoid short-circuiting with the secondary high frequency transmission line and for controlling the loss/leakage of electromagnetic energy out of the interconnection module, a slot along the thickness/height of interconnection module connecting the first cut-out and the second cut out configured to receive/transmit the electromagnetic energy from/to the first inset-fed patch at one end to/from the second inset-fed patch at other end. The interconnection module may further comprise one or more intermediate holes. Further the primary plated through holes, the secondary plated through holes and the intermediate holes are aligned coaxially for interconnection between the primary printed circuit board, the interconnection module, and the secondary printed circuit board using screws and nuts.

The embodiments herein, the various features, and advantageous details thereof are explained more fully with reference to the non-limiting embodiments that are illustrated in the accompanying drawings and detailed in the following description. Definitions of well-known components and processing techniques are omitted so as to not unnecessarily obscure the embodiments herein. In one example, an implementation of a device and method for interconnection of printed circuit boards operating at millimeter wave frequency band of 77 GHz is described. All the design values specified here relate to the millimeter wave frequency band of 77 GHz. However, the interconnection between any two printed circuit boards at extremely high frequencies may be implemented using the same device and method and will fall within the scope of the present subject matter.

Figure 5:
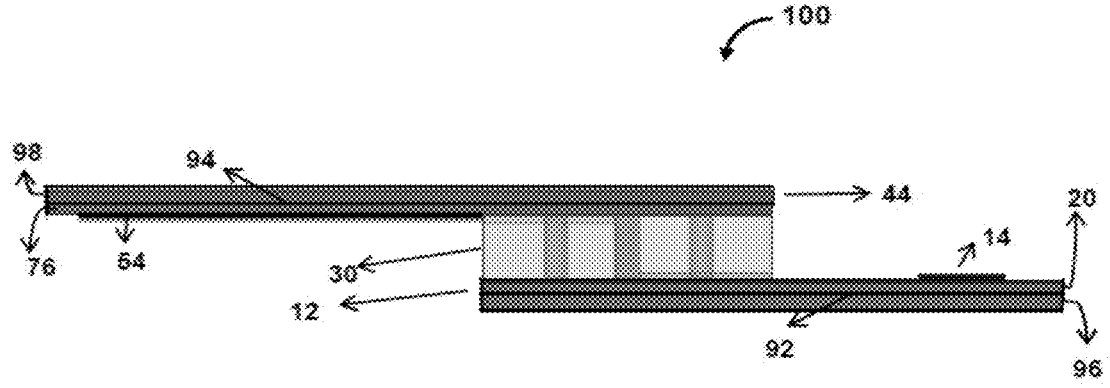
FIG. 5 illustrates a side view of the device comprising an interconnection module between a primary printed circuit board containing a radio frequency chip and a secondary printed circuit board containing an antenna array, in accordance with an embodiment of the present subject matter.

In the implementation, the placement of the radio frequency chip 14 on the primary printed circuit board 12 may be performed by automated pick and place machine. Further, the radio frequency chip 14 may be soldered to the top dielectric layer 20 through a reflow soldering process, as shown in FIG. 5. Plurality of ground vias 16 (shown in FIG. 2) may be provided to improve the radio frequency performance of the radio frequency chip 14. Plurality of thermal vias 18 may also be placed with adequate spacing from the solder balls to provide the necessary heat dissipation.

Figure 2:
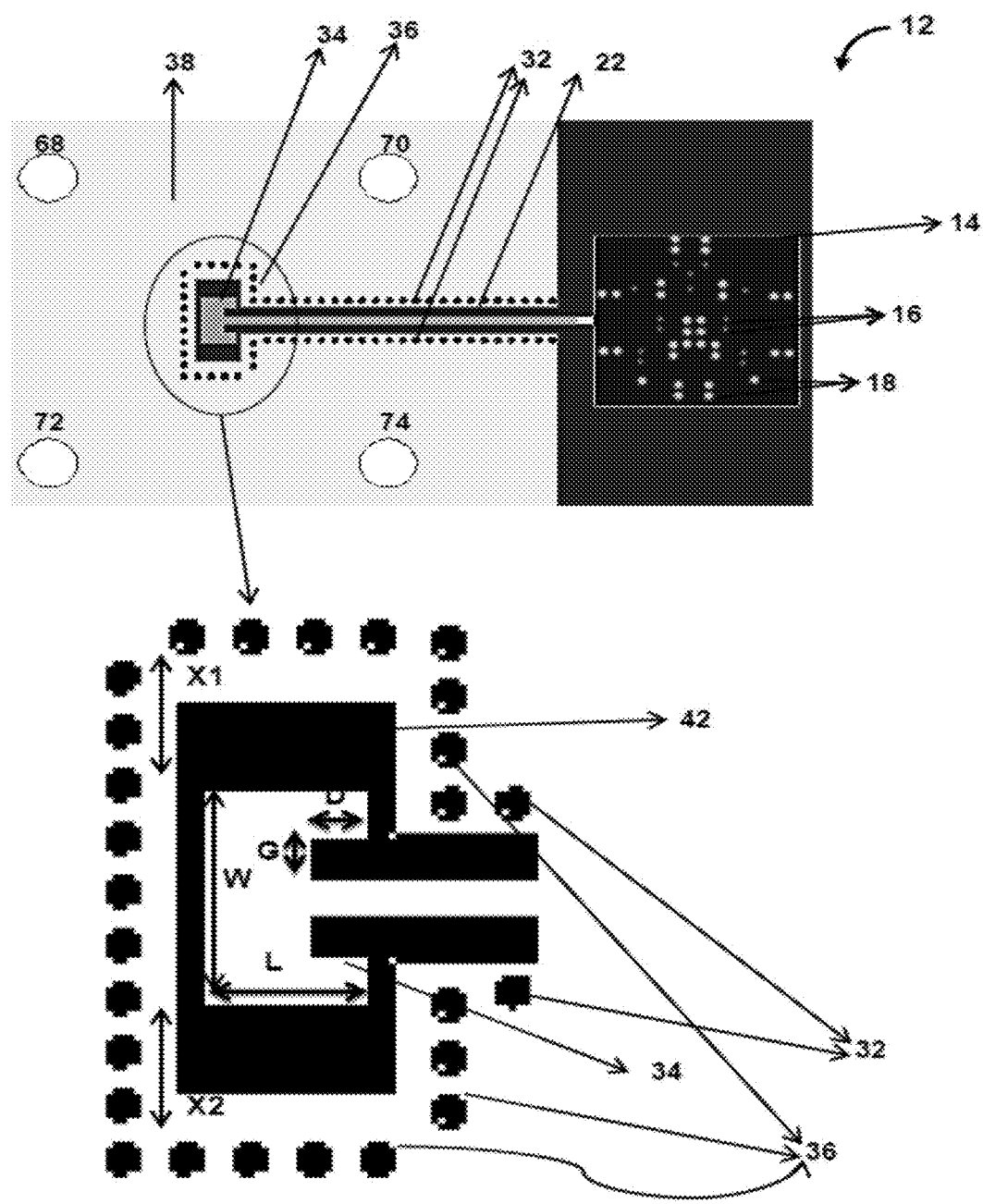
FIG. 2 illustrates a top view of the primary printed circuit board, in accordance with an embodiment of the present subject matter.

Further in the implementation, the top dielectric layers 20, 76, as shown in FIG. 5, may have a very low loss at extremely high frequencies because the high frequency transmission lines 22, 24, as shown in FIG. 2, 3, are entirely present in the top surface. Further, the bottom conducting surface immediately beneath the top conducting surface may be a full ground plane. In one example, Rogers3003 with a dielectric constant of 3.0 and dissipation factor of 0.0013 may be selected as the dielectric laminate because performance of the Rogers3003 dielectric laminate at high frequencies is good. The Rogers3003 dielectric laminate also provides great stability of electrical parameters over a wide range of temperatures. The dielectric loss tangent should be considerably low at high frequencies. In one example, the height of the dielectric laminate may be 5 mils (127 um), with 17 micrometers rolled (base) copper on either side before etching.

Figure 4:
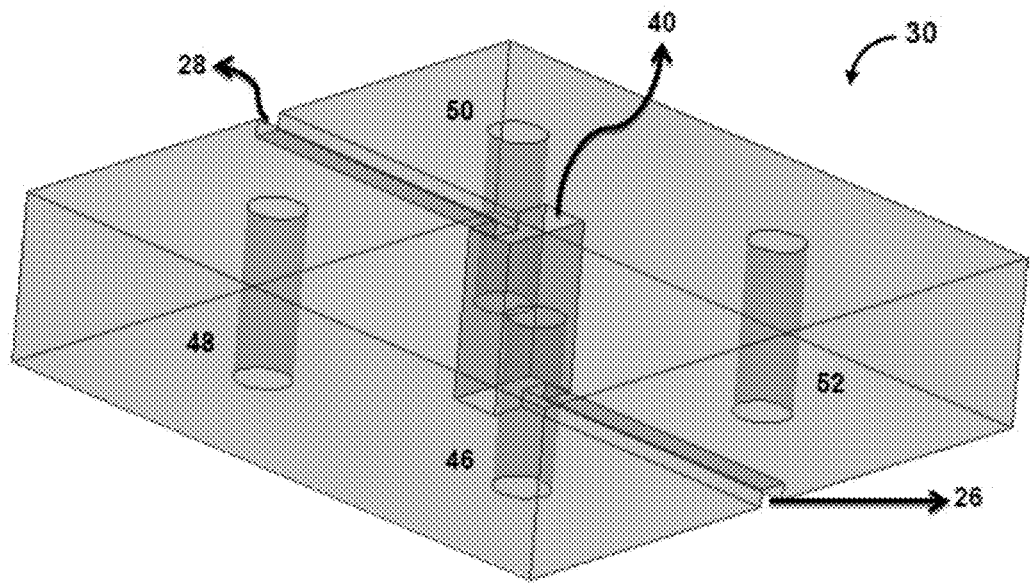
FIG. 4 illustrates an isometric view of the interconnection module, in accordance with an embodiment of the present subject matter.

At high frequencies of signal transmission, the skin depth may be very less and the signal tends to propagate more in the surface of the conductor than the dielectric substrate. Thus, in the implementation, additional importance may be given to the type of copper being used with the dielectric substrate. The roughness of copper may play a major role in signal degradation at EHF range for the aforementioned reasons. Hence, for the selected dielectric laminate, the rolled copper is selected to provide minimum roughness and hence least insertion loss. A very thin dielectric substrate may make the signal closely bound with the bottom conducting surface and also ensures that the width of the high frequency transmission lines 22, 24, may be very small. Further, the minimum width supports in creating cut-outs 26, 28, of smaller widths to reduce signal leakage out of the interconnection module 30 as shown in FIG. 4. Further, selection of a very thin dielectric laminate may reduce the propagation of undesirable higher order modes at high frequencies. The other layers of the dielectric substrate 96, 98 in the stack up of the printed circuit board may be made of different type of low cost materials such as FR4 laminates.

Further in the implementation, the high frequency transmission line 22 may connect the die of the radio frequency chip to the first inset-fed patch 34. In one example, the high frequency transmission line 22 may be one of micro strip, strip line, coplanar waveguide, coplanar waveguide with ground (CPWG) and the like. Further, the coplanar waveguide with ground (CPWG) configuration of the high frequency transmission line may provide very low insertion loss at higher frequencies. CPWG may be the best-suited transmission line configuration for the suppression of spurious modes at higher frequencies. Hence, the portion of transmission line connecting to the inset-fed patch is designed to be CPWG.

Further in the implementation of interconnection design, the ground vias 32 for the CPWG configuration may be very closely spaced to high frequency transmission line 22, and also closely spaced between them (vias) to avoid radiation losses and signal leakage. Furthermore, the high frequency transmission line 22 may be connected to the first inset-fed patch 34, with the particular closely knitted arrangement of ground vias 36 surrounding the first inset-fed patch and the specific copper ground shape 38 on the top surface of the printed circuit board, as shown in FIG. 2.

In one example, the length L of the inset-fed patch, determines the resonant frequency and the width W of same may be varied for impedance matching. The inset-distance D may help in additional impedance matching whereas the inset-gap G may provide capacitance effect to tune out any inductive reactance of the interconnection module. The dimensions of this inset-fed patch may also be designed and tuned based on the height/thickness for example 5 mm, of the interconnection module. In one example the dimension of the inset-fed patch will be W=1.054 mm, L=1.6 mm, Inset distance=0.27 mm, Inset gap=0.09 mm. Further, the inset-fed patch 34 couples the energy into one side of the slot 40 of the interconnection module 30. The copper (ground) on the top conductive layer above the top dielectric substrate may be etched off/removed in a rectangular shape around the inset-fed patch 34. The shape and size of this copper etch off portion 42 may be slightly lesser, (for example 0.1 mm lesser in both length as well as width) than the slot dimensions of the interconnection module 30. This may enable the interconnection module to get entirely connected both physically and electrically to the printed circuit boards 12 & 44, while taking in to consideration the production tolerances.

In the implementation, the electromagnetic energy from the inset-fed patch 34 gets coupled into the interconnection module 30. Further, the portion around the etched-off copper may closely surrounded by the ground vias 36. In one example, the diameter of the vias may be designed to reduce losses for high frequency applications, and may be calculated to be much lesser than one-fifth of the guided-wavelength for example 8 mils or 0.2032 mm. The ground vias may be very close to each other. The inter-via spacing, for example 0.4 mm may be calculated to be less than or equal to twice the via diameter to avoid leakage of energy into other portions of the substrate. The distance between the ground vias and the inset-fed patch X1, X2 (as shown in FIG. 2) may be varied for better impedance matching and to obtain high bandwidth interconnection. In one example, the values X1, X2 are designed based on electromagnetic analyses and high frequency solvers.

Further in the implementation, FIG. 4 shows the interconnection module 30 which is connected between the primary printed circuit board and the secondary printed circuit board. The interconnection module made of metal, 30 comprises of a slot 40 at the centre, plurality of cut-outs 26, 28 and plurality of holes 46, 48, 50, 52. In one example, the dimensions of the interconnection module 30 may be equal to 20 mm*20 mm*5 mm. Further, the size and shape of the slot 40 may be determined based on the frequency of operation. In one example, a rectangular slot 40 of the dimensions 3.1 mm*1.55 mm*5 mm may be utilized. Further, the dimensions of the slot may not be equal to the dimension of standard waveguides flanges, but may be able to eliminate the higher order modes and allow the dominant $TE_{10}$ mode to propagate through the interconnection module 30 in the frequency range of interest. The plurality of holes 46, 48, 50, 52, for example of 1.7 mm diameter, may be drilled into the interconnection module 30 for alignment and interconnection with the primary and secondary printed circuit boards 12, 44.

In one example, if the output of the radio frequency chip 14 needs to be tested or the printed array antenna 54 parameters need to be validated using an equipment with (WR) standard waveguide, the slot 40 and the plurality of holes 46, 48, 50, 52 may be designed and fabricated as per dimensions and specifications of the standard waveguides for example, WR-10, WR-12, WR-15, and the like. Further, the rectangular cut-outs 26, 28 are etched off from the interconnection module in two of its opposite faces, starting from the centre of one of its edges parallel to the broad edge of the slot 40 and ending at centre of broad edge of the slot 40 as shown in FIG. 4, so that the interconnection module does not get short-circuited with the primary high frequency transmission line 22 and the secondary high frequency transmission line 24 on the top surfaces of primary and secondary printed circuit boards 12, 44. The dimensions of the first and second cut-outs 26, 28 may be manufactured as small as possible for example 9.225 mm*0.9 mm*0.5 mm, so as to reduce the leakage of electromagnetic energy out of the interconnection module 30. The centres of the inset-fed patches 34, 56 in both the printed circuit boards 12, 44 and the centre of the rectangular slot 40 in the interconnection module 30 may be aligned in a collinear form, so that the interconnection may be highly efficient. The interconnection module 30 may be connected to the printed circuit boards 12, 44 with conductive glue in addition to the screws and nuts.

Figure 3:
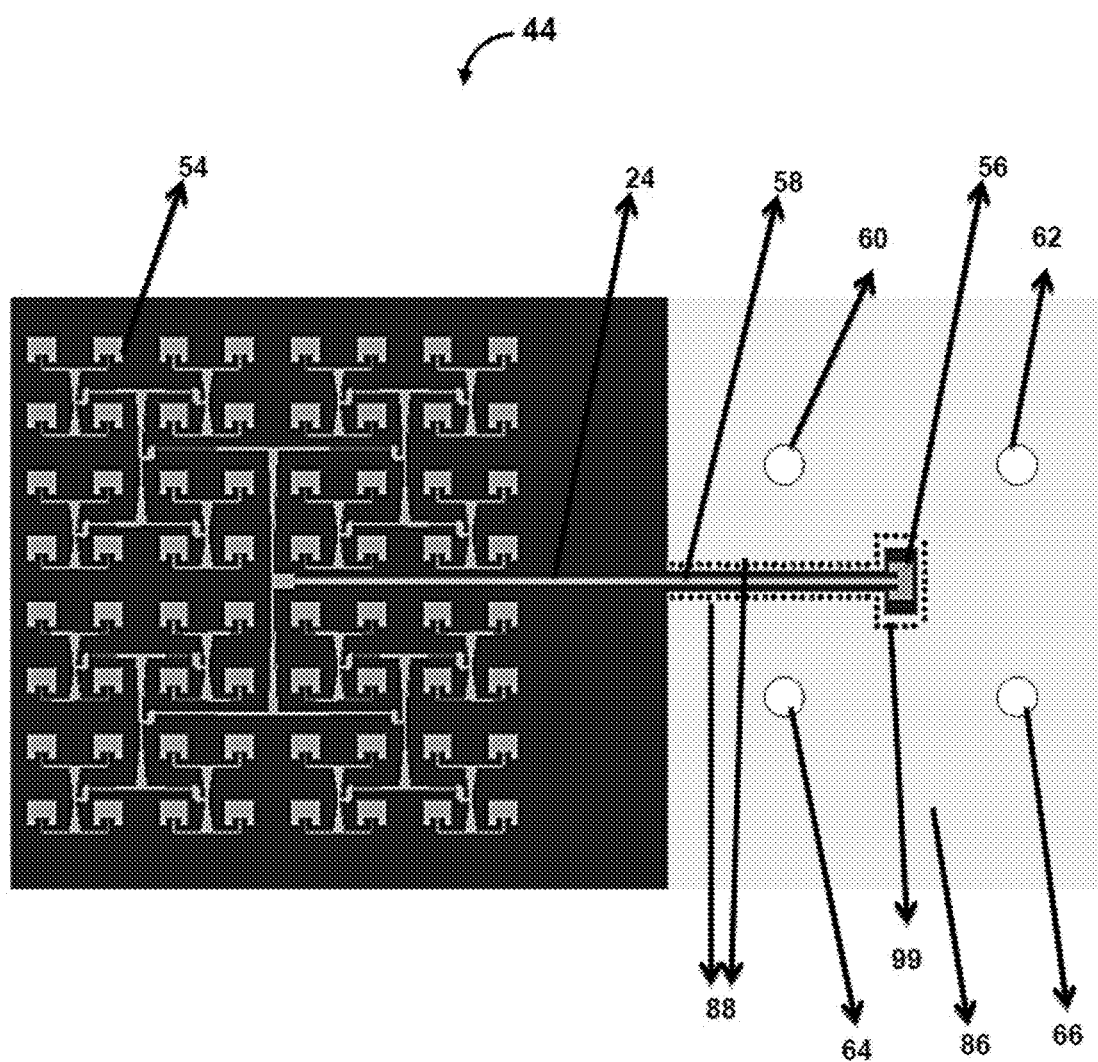
FIG. 3 illustrates a top view of the secondary printed circuit board, in accordance with an embodiment of the present subject matter.

FIG. 3 shows the secondary printed circuit board 44, where the energy from the interconnection module 30 couples into the secondary high frequency transmission line 24 through second inset-fed patch design 56. The dimensions of the second inset-fed patch 56 may be varied slightly as compared to the first inset-fed patch 34, so that a broadband interconnection design may be achieved. The conversion from CPWG transmission line 58 to micro strip transmission line 24 may be implemented by varying the width of the secondary high frequency transmission 24, for example in some cases, the width may be equal to 0.29 mm for both transmission lines. Thereby, the CPWG transmission line 58 from the inset-fed patch 56 gets connected to the micro strip transmission line which leads to a micro strip patch antenna array 54.

In the implementation, the antenna 54 may be designed to be a printed array antenna for achieving high gain and having an additional control on beam width. In one example, an 8×8 array antenna may be designed with corporate feed network. The amplitude and phase distribution may be altered to have a trade-off between maximum gains vs. side lobe levels. Since the radiation from the printed array antenna 54 has to propagate in free space, necessary isolation needs to be provided from other components viz. the interconnection module, primary printed circuit board 12, etc. So, the orientation of the secondary printed circuit board 44 may be adjusted in such a way that it is properly isolated from the primary printed circuit board 12, as shown in the figures. But for other embodiments not involving an antenna, the orientation of both the printed circuit boards 12, 44 may be in the same direction as well. In the implementation, the primary and secondary printed circuit boards 12, 44 may comprise plurality of holes 60, 62, 64, 66, 68, 70, 72, 74, with the diameter and position similar to the plurality of holes 46, 48, 50, 52 in the interconnection module 30, for alignment and electrical connection with the interconnection module 30.

Figure 6:
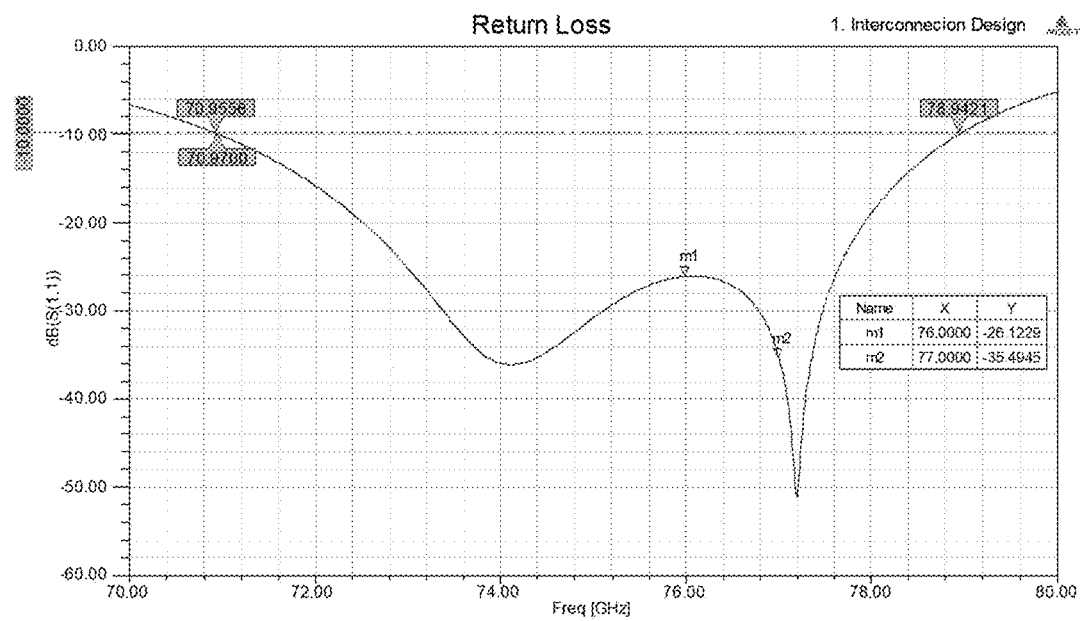
FIGS. 6A and 6B shows electrical characteristics, in accordance with an embodiment of the present subject matter.
Figure 6:

FIGS. 6A and 6B shows electrical characteristics, in accordance with an embodiment of the present subject matter. In particular, the simulation result of return loss plot is shown in FIG. 6A. The return loss is the ratio of the amount of energy reflected back to the amount of energy incident. Return Loss can be denoted as $10*\log_{10} (P_r/P_i)$. The simulation result in FIG. 6A shows that the return loss value is better than −10 dB for a wide bandwidth (~8 GHz). The insertion loss is the loss involved in the transmission of signal/energy from one point to another. The insertion loss of just the interconnection region from the primary printed circuit board to the secondary printed circuit board through the interconnection module is 0.20 dB, as shown in FIG. 6B. It may be understood from the FIG. 6B that the insertion loss achieved is incredibly low for the frequency band of operation. Hence, a very highly efficient, low-loss interconnection device and method have been implemented at EHF range.

Figure 7:
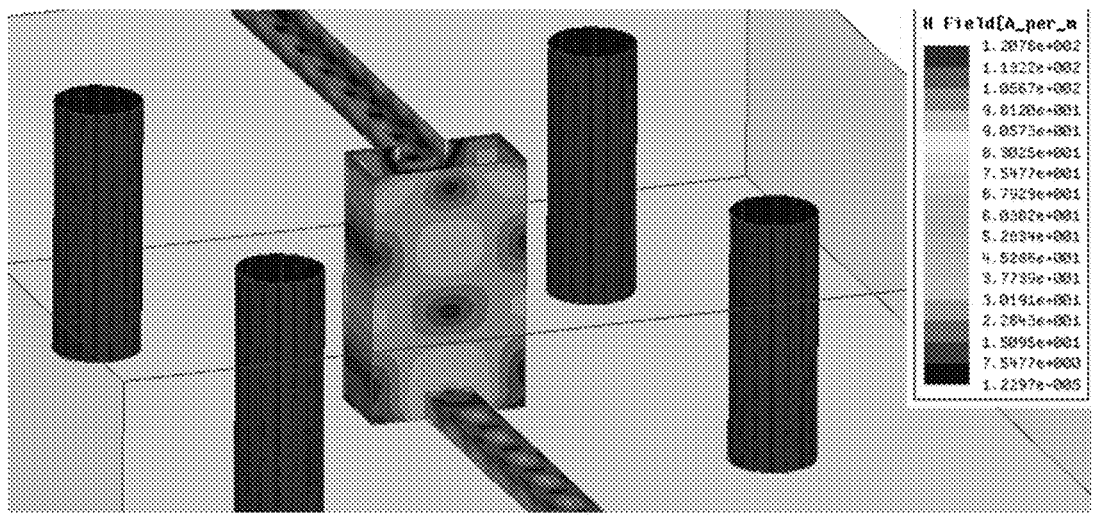
FIGS. 7A and 7B shows the magnetic field distribution in the interconnection module and the inset-fed patch respectively, in accordance with an embodiment of the present subject matter.
Figure 7:
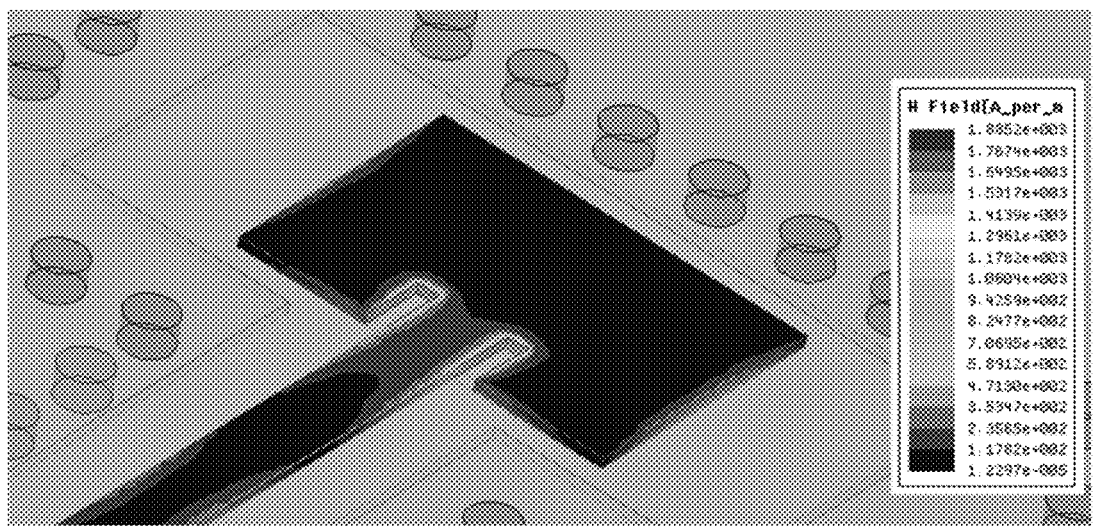

FIGS. 7A and 7B shows the magnetic field distribution in the interconnection module and the inset-fed patch respectively, in accordance with an embodiment of the present subject matter. In the implementation, the TEM mode of signal propagating through the high frequency transmission lines 22, 24 may get transferred to the inset-fed patches 34, 56 at the edge of the high frequency transmission lines 22, 24. This inset-fed patches 34, 56 along with the arrangement of the ground vias 36 around the inset-fed patches 34, 56 help in spurious mode suppression and prevents resonant mode propagation between the signal and ground planes. The close spacing of between the ground vias i.e. very small pitch of via holes creates a highly successful interconnection. Not only these on-board design elements, but also the slot 40 dimensions of the interconnection module 30 are designed for only dominant mode $TE_{10}$ propagation. Therefore, the TEM wave from the primary printed circuit board gets converted to the dominant $TE_{10}$ mode in the interconnection module 30.

Figure 8:
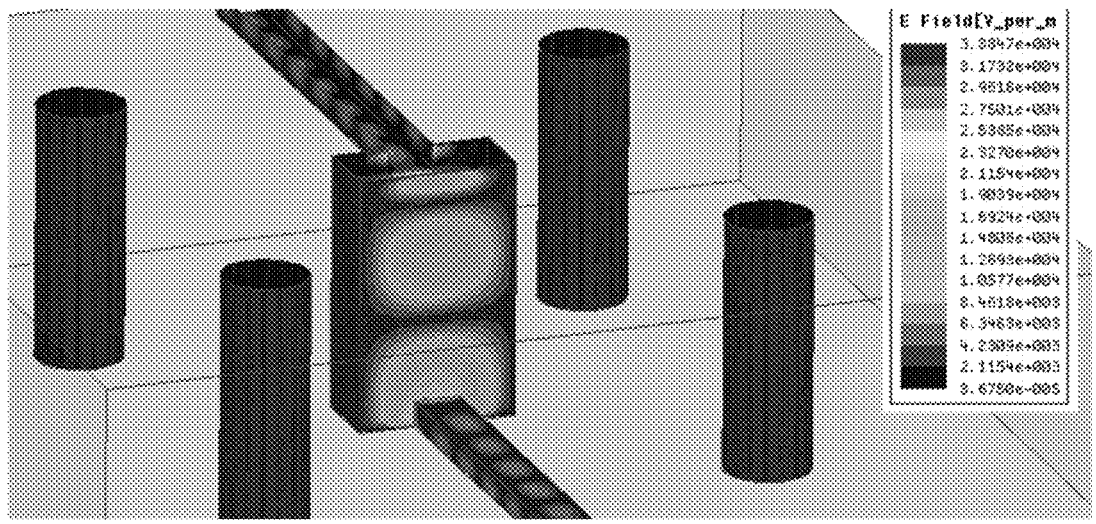
FIGS. 8A and 8B shows the electric field distribution in the interconnection module and the inset-fed patch respectively, in accordance with an embodiment of the present subject matter.
Figure 8:
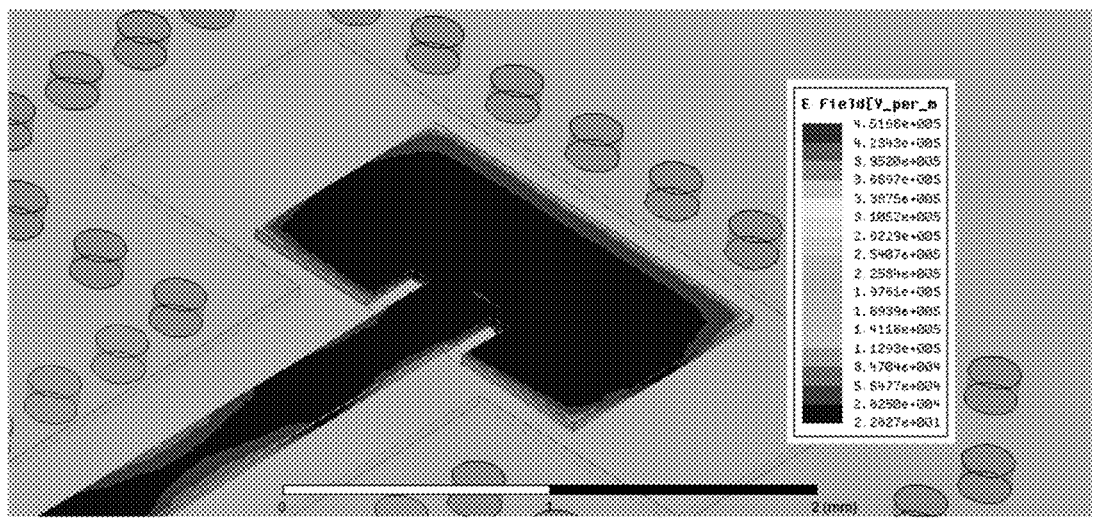

The energy transfer mechanism may be analysed and visualized clearly in the FIG. 7A, which shows the magnetic field distribution along the slot and cut-outs of the interconnection module. The FIG. 7B shows the magnetic field distribution in the inset-fed patch, which clearly suggest that the high density fields are concentrated in the edges of the inset-fed patch, which get efficiently coupled into the interconnection module 30 due to via design and ground plane design. The propagation through the interconnection module 30 may be attributed to least amount of losses. In one example, the interconnection module 30 may be gold-coated to decrease losses. The dominant $TE_{10}$ gets coupled back to TEM wave in CPWG line 58 on the secondary printed circuit board. Since the antenna in the secondary printed circuit board is in micro strip configuration, due care is taken in design, since the mode of propagation gets converted from TEM to quasi-TEM, when the signal travels from CPWG 58 to micro strip 24. FIGS. 8A and 8B shows the electric field distribution in the interconnection module and the inset-fed patch respectively, in accordance with an embodiment of the present subject matter.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and is not limiting. Exemplary embodiments for interconnection of printed circuit boards operating at millimeter wave frequency band discussed above may provide certain advantages. Though not required to practice aspects of the disclosure, these advantages may include those provided by the following features.

Some embodiments of the device and the method achieve maximum coupling and highly efficient signal propagation between printed circuit boards.

Some embodiments of the device and the method is that the interconnection is implemented directly between top layers of the printed circuit boards without back-wall waveguide short or without a cavity in the printed circuit boards Some embodiments of the device and the method comprise a unique inset-fed micro strip patch coupling element along with CPWG transmission line, particular arrangement of vias and specific ground plane shape on top surface of printed circuit board Some embodiments of the device and the method utilize a signal propagation mode conversion technique between the printed circuit boards and the interconnection module.

Some embodiments of the device and the method utilize specific arrangement of electrically conducting vias in the dielectric substrate to establish a strong electrical connection to both ground planes for the CPWG based transmission line and near the interconnection region to reduce the signal leakage and losses involved.

Some embodiments of the device and the method enable the interconnection directly between top layers of two printed circuit boards.

Some embodiments of the device and the method are applicable to a wide range of high frequency signals— Extremely High Frequencies (EHF) (30-300 GHz).

Some embodiments of the device and the method enable the signal propagation directly between the top layers of the two printed circuit boards through a specially designed interconnection module.

Some embodiments of the device and the method enable reduction of the signal propagation loss and to achieve a highly efficient interconnection.

Some embodiments of the device and the method enable elimination of the necessity of any cut-outs/cavities in any of the dielectric layers of the multilayer printed circuit boards.

Some embodiments of the device and the method offer a better mechanical stability through the interconnection module.

Some embodiments of the device and the method enhance the electrical performance at millimeter wave frequencies through controlled plating thickness of the interconnection module.

Although implementations for methods and devices for interconnection of printed circuit boards operating at millimeter wave frequency band have been described in language specific to structural features and/or methods, it is to be understood that the appended claims are not necessarily limited to the specific features or methods described. Rather, the specific features and methods are disclosed as examples of implementations for interconnection of printed circuit boards operating at millimeter wave frequency band.

We claim:

1. A device for interconnection of printed circuit boards operating at millimetre wave frequency band, the device comprising:
    a primary printed circuit board (12) comprising a primary top dielectric layer (20) on the primary printed circuit board (12), a radio frequency chip (14) on the primary top dielectric layer (20), a primary high frequency transmission line (22) extending from the radio frequency chip (14) and connected to the radio frequency chip (14) at one end, a first inset-fed patch (34) connected to other end of the high frequency transmission line (22), a first arrangement of ground vias (32) surrounding the primary high frequency transmission line (22), a second arrangement of ground vias (36) surrounding the first inset-fed patch (34), wherein the first arrangement of ground vias (32), and the second arrangement of ground vias (36) form a ground connection between a ground shape (38) on the primary top conductive surface and primary bottom conductive surface ground plane (92);
    a secondary printed circuit board (44) comprising a secondary top dielectric layer (76) on the secondary printed circuit board (44), a printed array antenna (54) on the secondary top dielectric layer (76), a secondary high frequency transmission line (58) extending from the printed array antenna (54) and connected to printed array antenna (54) at one end, a second inset-fed patch (56) connected to other end of the high frequency transmission line (58), a third arrangement of ground vias (88) surrounding the secondary high frequency transmission line (58), a fourth arrangement of ground vias (99) surrounding the second inset-fed patch (56), wherein the third arrangement of ground vias (88), and the fourth arrangement of ground vias (99) form a ground connection between a ground shape (86) on the secondary top conductive surface and a secondary bottom conductive surface ground plane (94); and
    an interconnection module (30) for coupling an electromagnetic energy from the primary printed circuit board (12) to the secondary printed circuit board (44), wherein the interconnection module (30) further comprising a first cut-out section (28) on one surface of the interconnection module (30) a second cut-out section (26) on opposite surface of the interconnection module (30), a slot (40) along the thickness of the interconnection module (30), connecting the first cut-out section (28) and the second cut out section (26), wherein the slot (40) is configured to receive the first inset-fed patch (34) at one end and the second inset-fed patch (56) at other end and transfer the electromagnetic energy from the first inset-fed patch (34) to the second inset-fed patch (56).

2. The device in claim 1,
    wherein the first cut-out section (28) is configured to prevent short-circuiting between the interconnection module (30) and the secondary high frequency transmission line (58) and controlling one of a loss and a leakage of the electromagnetic energy; and
    wherein the second cut-out section (26) is configured for preventing short-circuiting between the interconnection module (30) and the primary high frequency transmission line (22) and controlling one of a loss and a leakage of the electromagnetic energy.

3. The device as claimed in claim 1, wherein
    the primary printed circuit board (12) further comprising one or more primary plated through holes (68, 70, 72, 74);
    the secondary printed circuit board (44) further comprising one or more secondary plated through holes (60, 62, 64, 66);
    the interconnection module (30) further comprising one or more intermediate holes (46, 48, 50, 52); and
    wherein the one or more primary plated through holes (60, 62, 64, 66), the one or more secondary plated through holes (68, 70, 72, 74), and the one or more intermediate holes (46, 48, 50, 52) are aligned coaxially for connection through screws and nuts, for coupling the electromagnetic energy from the primary printed circuit board (12) to the secondary printed circuit board (44).

4. The device as claimed in claim 1, wherein the primary printed circuit board (12) further comprises a primary top conductive surface and a primary bottom conductive surface, and the secondary printed circuit board (44) further comprises a secondary top conductive surfaces and a secondary bottom conductive surfaces; wherein the primary top conductive surface, the primary bottom conductive surfaces, the secondary top conductive surface and the secondary bottom conductive surfaces are made of copper.

5. The device as claimed in claim 1, wherein the ground shape 38 of the primary printed circuit board (12) and the ground shape 86 of the secondary printed circuit board (44) are one of etched off or removed around the first inset-fed patch (34) and the second inset-fed patch (56) respectively, and wherein the etched off section is surrounded by ground vias (36) and (99) respectively.

6. The device as claimed in claim 1, wherein the ground vias (32), (88), (36) and (99) diameter is 0.2032 mm and centre-to-centre distance between the ground vias (32), (88), (36) and (99) is equal to 0.4 mm.

7. The device as claimed in claim 1, wherein the dimensions of the first inset-fed patch (34) and the second inset-fed patch (56) are based on the thickness of the interconnection module (30).

8. The device as claimed in claim 1, wherein the device is configured for all Extremely High Frequency (EHF) (30-300 GHz) applications.

9. The device as claimed in claim 1, wherein the dielectric layer (20) of the primary printed circuit board (12) and dielectric layer (76) of the secondary printed circuit board (44) is one of a single layer and a multi-layer.

10. The device in claim 1, wherein the interconnection is achieved directly between a top surface of the primary printed circuit board (12) and a top surface of the secondary printed circuit board (44), without one or more of a back wall, a waveguide short or without, a cavity, and a cut-out located in any of the primary printed circuit board (12) and the secondary printed circuit board (44).

11. A method for interconnection of printed circuit boards operating at millimetre wave frequency band, the method comprising:

obtaining a primary printed circuit board (12) comprising a primary top dielectric layer (20) on the primary printed circuit board (12), a radio frequency chip (14) on the primary top dielectric layer (20), a primary high frequency transmission line (22) extending from the radio frequency chip (14) and connected to the radio frequency chip (14) at one end, a first inset-fed patch (34) connected to other end of the high frequency transmission line (22), a first arrangement of ground vias (32) surrounding the primary high frequency transmission line (22), a second arrangement of ground vias (36) surrounding the first inset-fed patch (34), wherein the first arrangement of ground vias (32), and the second arrangement of ground vias (36) form a ground connection between a ground shape (38) on the primary top conductive surface and primary bottom conductive surface ground plane (92);

obtaining a secondary printed circuit board (44) comprising a secondary top dielectric layer (76) on the secondary printed circuit board (44), a printed array antenna (54) on the secondary top dielectric layer (76), a secondary high frequency transmission line (58) extending from the printed array antenna (54) and connected to printed array antenna (54) at one end, a second inset-fed patch (56) connected to other end of the high frequency transmission line (58), a third arrangement of ground vias (88) surrounding the secondary high frequency transmission line (58), a fourth arrangement of ground vias (99) surrounding the second inset-fed patch (56), wherein the third arrangement of ground vias (88), and the fourth arrangement of ground vias (99) form a ground connection between a ground shape (86) on the secondary top conductive surface and a secondary bottom conductive surface ground plane (94); and coupling an electromagnetic energy from the primary printed circuit board (12) to the secondary printed circuit board (44) utilizing an interconnection module (30), wherein the interconnection module (30) further comprising a first cut-out section (28) on one surface of the interconnection module (30) a second cut-out section (26) on opposite surface of the interconnection module (30), a slot (40) along the thickness of the interconnection module (30), connecting the first cut-out section (28) and the second cut out section (26), wherein the slot (40) is configured to receive the first inset-fed patch (34) at one end and the second inset-fed patch (56) at other end and transfer the electromagnetic energy from the first inset-fed patch (34) to the second inset-fed patch (56).

12. The method in claim 11,
wherein the first cut-out section (28) is configured to prevent short-circuiting between the interconnection module (30) and the secondary high frequency transmission line (58) and controlling one of a loss and a leakage of the electromagnetic energy; and wherein the second cut-out section (26) is configured for preventing short-circuiting between the interconnection module (30) and the primary high frequency transmission line (22) and controlling one of a loss and a leakage of the electromagnetic energy.

13. The method as claimed in claim 11, wherein
the primary printed circuit board (12) further comprising one or more primary plated through holes (68, 70, 72, 74);
the secondary printed circuit board (44) further comprising one or more secondary plated through holes (60, 62, 64, 66);
the interconnection module (30) further comprising one or more intermediate holes (46, 48, 50, 52); and
wherein the one or more primary plated through holes (60, 62, 64, 66), the one or more secondary plated through holes (68, 70, 72, 74), and the one or more intermediate holes (46, 48, 50, 52) are aligned coaxially for connection through screws and nuts, for coupling the electromagnetic energy from the primary printed circuit board (12) to the secondary printed circuit board (44).

14. The method as claimed in claim 11, wherein the primary printed circuit board (12) further comprises a primary top conductive surface and a primary bottom conductive surface, and the secondary printed circuit board (44) further comprises a secondary top conductive surfaces and a secondary bottom conductive surfaces; wherein the primary top conductive surface, the primary bottom conductive surfaces, the secondary top conductive surface and the secondary bottom conductive surfaces are made of copper.

15. The method as claimed in claim 11, wherein the ground shape 38 of the primary printed circuit board (12) and the ground shape (86) of the secondary printed circuit board (44) are one of etched off or removed around the first sinset-fed patch (34) and the second inset-fed patch (56) respectively, and wherein the etched off section is surrounded by ground vias (36) and (99) respectively.

16. The method as claimed in claim 11, wherein the ground vias (32), (88), (36) and (99) diameter is 0.2032 mm and centre-to-centre distance between the ground vias (32), (88), (36) and (99) is equal to 0.4 mm.

17. The method as claimed in claim 11, wherein the dimensions of the first inset-fed patch (34) and the second inset-fed patch (56) are based on the thickness of the interconnection module (30).

18. The method as claimed in claim 11, wherein the method is implemented for Extremely High Frequency (EHF) applications in the range of 30-300 GHz.

19. The method as claimed in claim 11, wherein the dielectric layer (20) of the primary printed circuit board (12) and dielectric layer (76) of the secondary printed circuit board (44) is one of a single layer and a multi-layer.

20. The method in claim 11, wherein the interconnection is achieved directly between a top surface of the primary printed circuit board (12) and a top surface of the secondary printed circuit board (44), without one or more of a back wall, a waveguide short or without, a cavity, and a cut-out located in any of the primary printed circuit board (12) and the secondary printed circuit board (44).

* * * * *